United States Patent [19]

Tanaka et al.

[11] Patent Number: 5,306,921
[45] Date of Patent: Apr. 26, 1994

[54] ION IMPLANTATION SYSTEM USING OPTIMUM MAGNETIC FIELD FOR CONCENTRATING IONS

[75] Inventors: Hisato Tanaka, Nirasaki; Naoki Takayama, Koufu, both of Japan

[73] Assignee: Tokyo Electron Limited, Tokyo, Japan

[21] Appl. No.: 25,137

[22] Filed: Mar. 2, 1993

[30] Foreign Application Priority Data

| Mar. 2, 1992 | [JP] | Japan | 4-080512 |
| Mar. 2, 1992 | [JP] | Japan | 4-080513 |
| Mar. 2, 1992 | [JP] | Japan | 4-080514 |
| Mar. 14, 1992 | [JP] | Japan | 4-089756 |
| Mar. 23, 1992 | [JP] | Japan | 4-095907 |

[51] Int. Cl.$^5$ .................. H01J 27/02; H01J 37/00
[52] U.S. Cl. .................. 250/492.21; 250/423 R; 315/111.41
[58] Field of Search ............ 250/492.2, 423 R, 425, 250/427, 423 F, 492.21; 315/111.21, 111.41, 111.81, 111.71

[56] References Cited

U.S. PATENT DOCUMENTS

| 4,757,237 | 7/1988 | Hellblom et al. | 315/111.81 |
| 4,859,908 | 8/1989 | Yoshida et al. | 315/111.81 |
| 5,051,659 | 9/1991 | Uhm et al. | 315/111.41 |
| 5,083,061 | 1/1992 | Koshiishi et al. | 315/111.81 |
| 5,089,747 | 2/1992 | Koshiishi et al. | 315/111.81 |

Primary Examiner—Jack I. Berman
Assistant Examiner—James Beyer
Attorney, Agent, or Firm—Oblon, Spivak, McClelland, Maier & Neustadt

[57] ABSTRACT

Electric discharge gas is made into auxiliary plasma in an electron generating chamber and electrons in the generated auxiliary plasma are introduced into an ion generating chamber. Electrons collide with molecules of material gas in the ion generating chamber to generate primary plasma. Ions in the ion generating chamber are drawn out of the primary plasma through an opening of the ion generating chamber. A magnetic field is formed by electromagnets in order to bring the plasma in the ion generating chamber into a concentrated state. A control unit is provided to store data representing optimum magnetic field intensities for ions of different types involved. The control unit so controls current applied by the power supply for the electromagnets as to produce an optimum magnetic field intensity for the type of ions to be drawn.

21 Claims, 15 Drawing Sheets

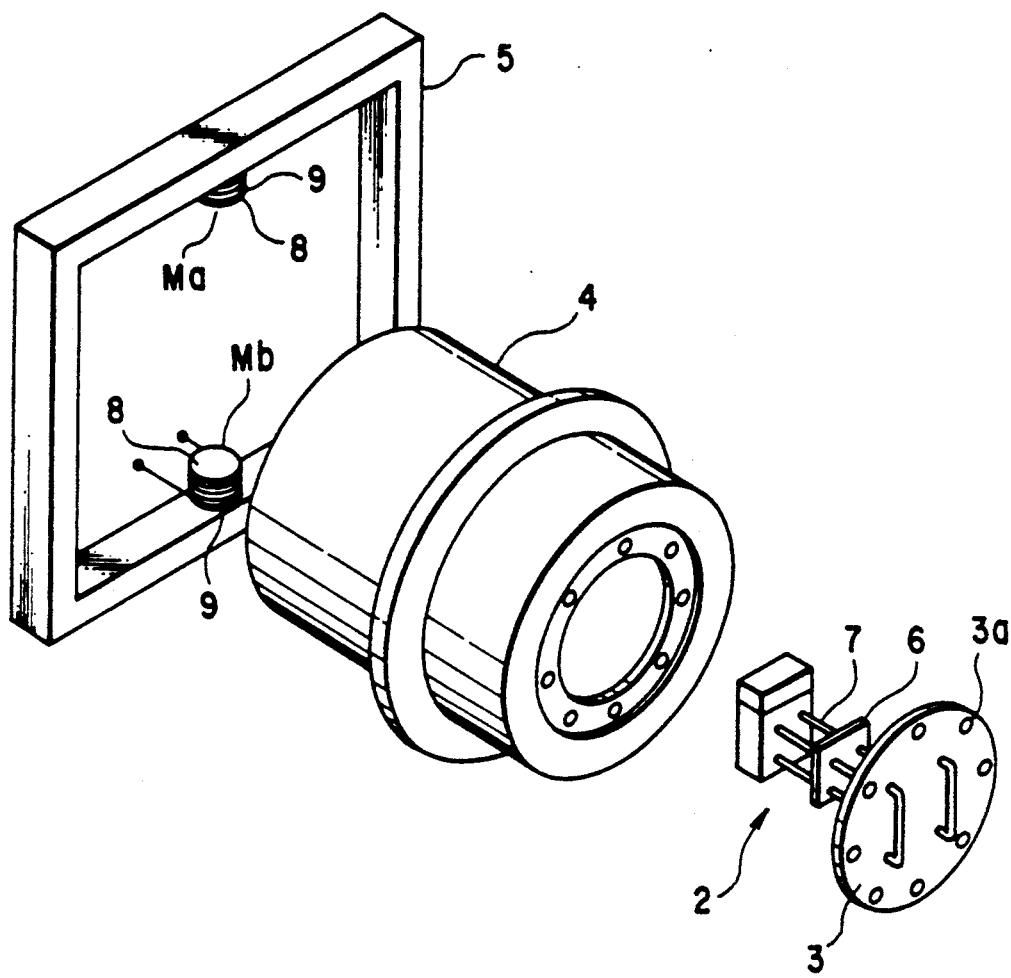
F I G. 1

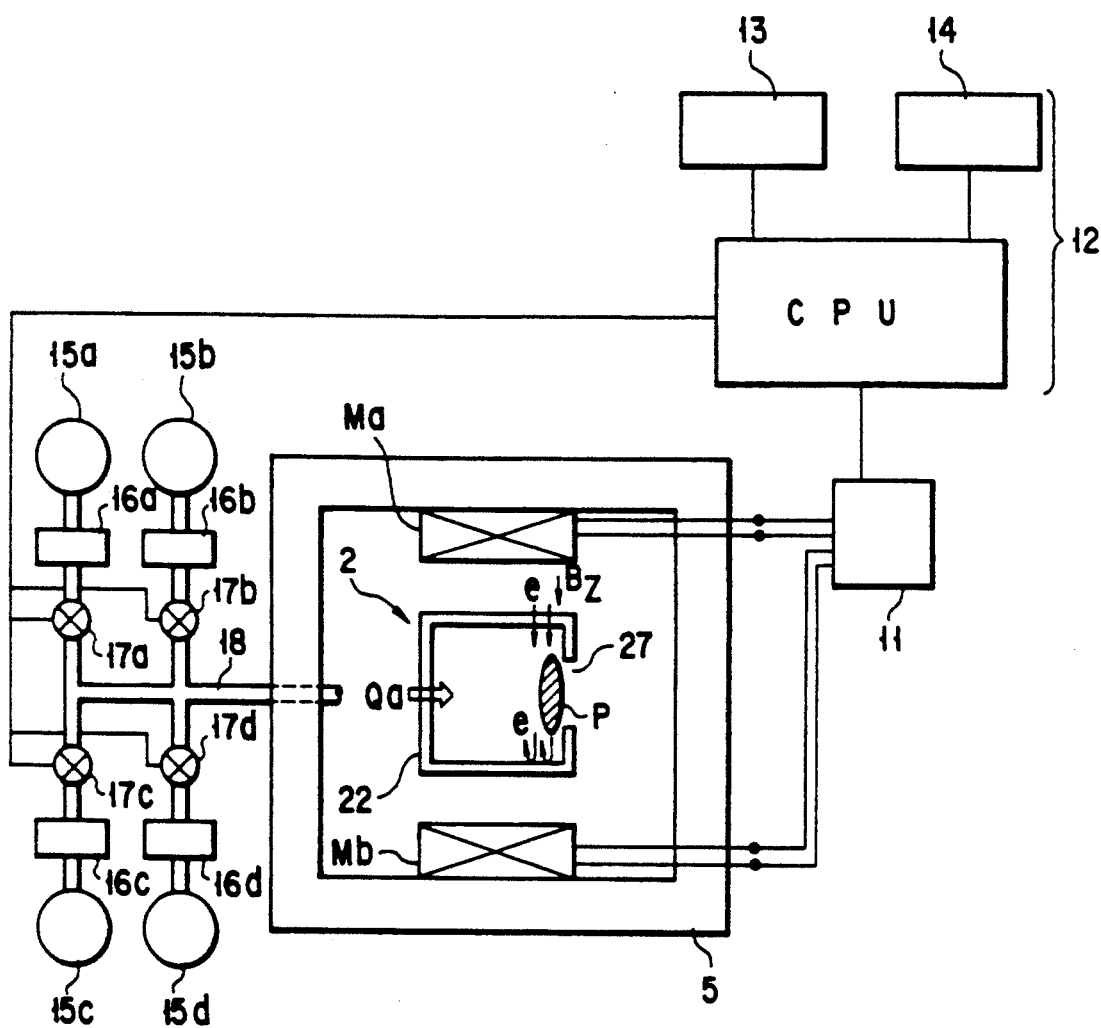
F I G. 3

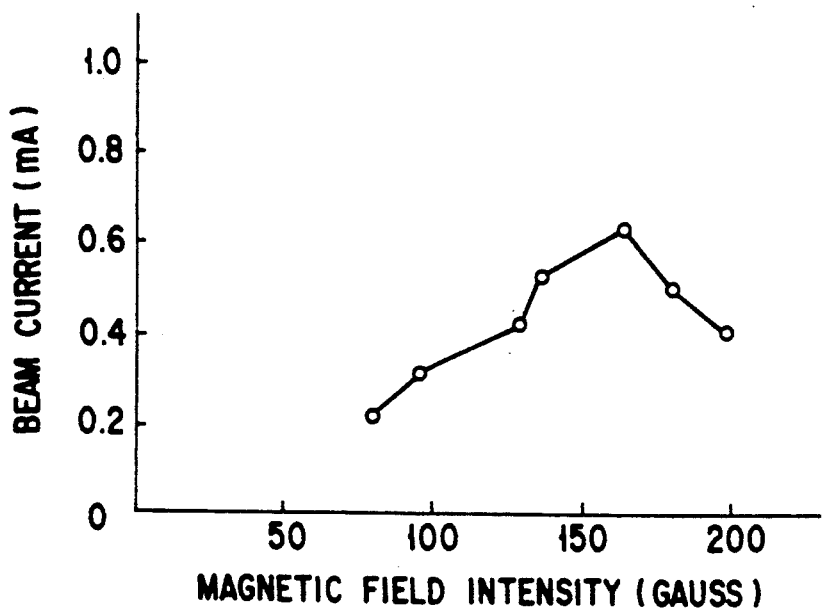
F I G. 4
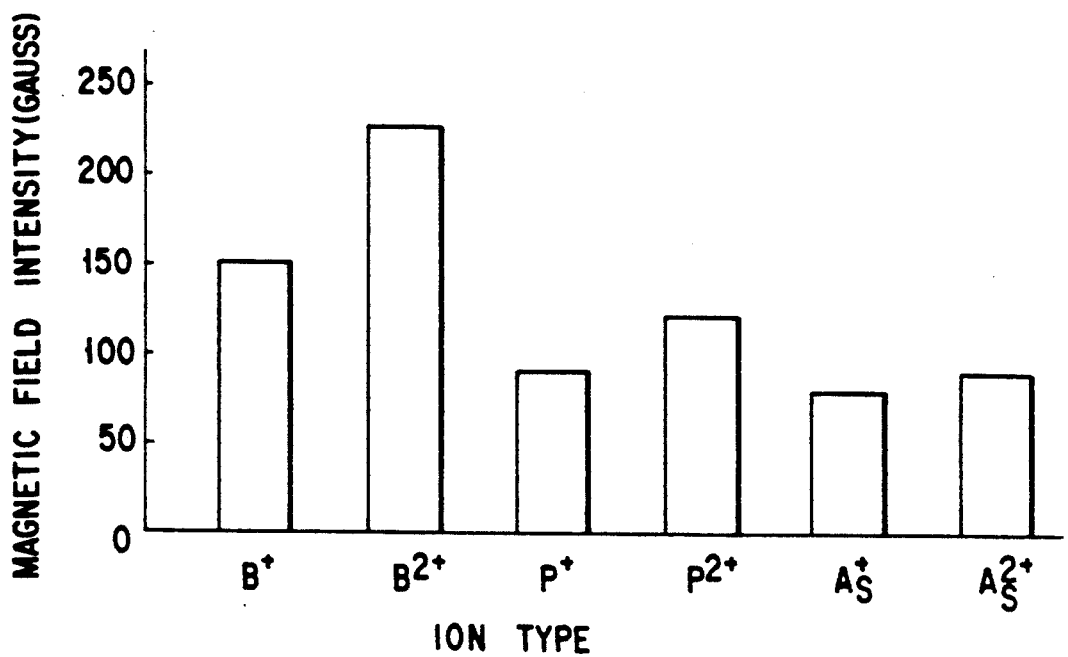
F I G. 5

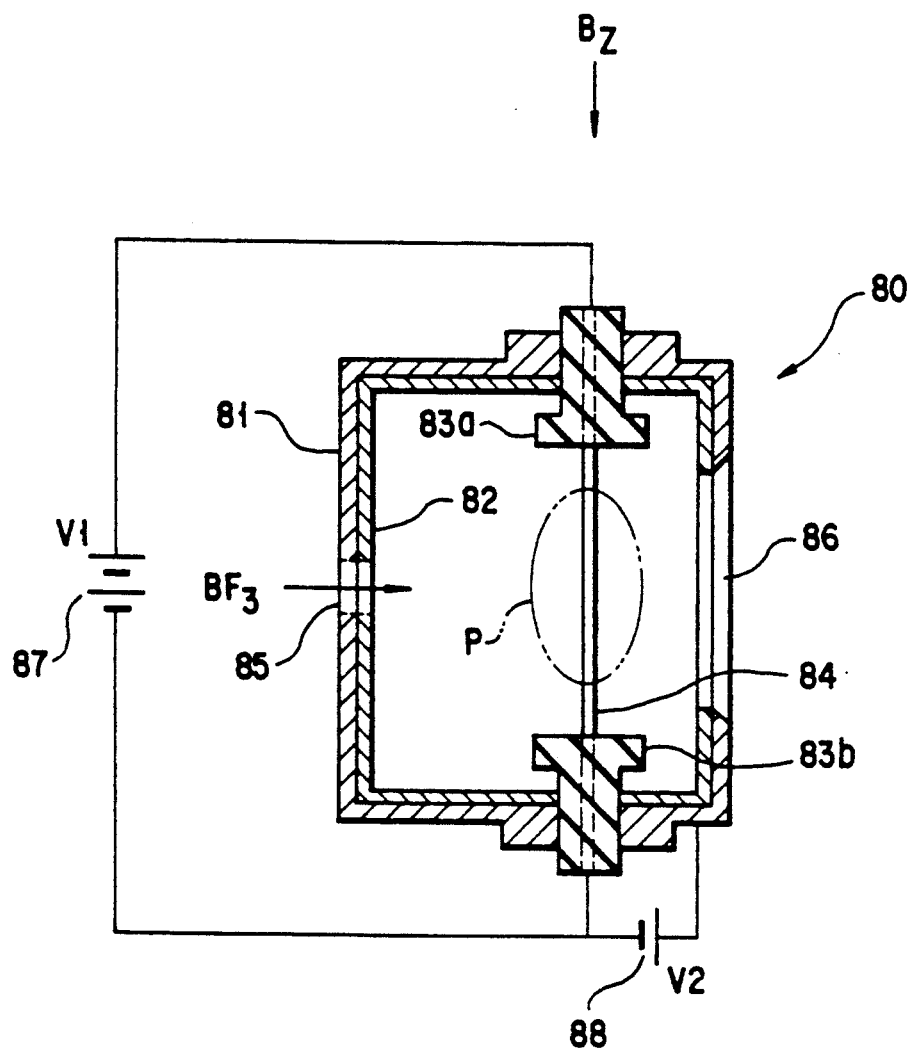
F I G. 6

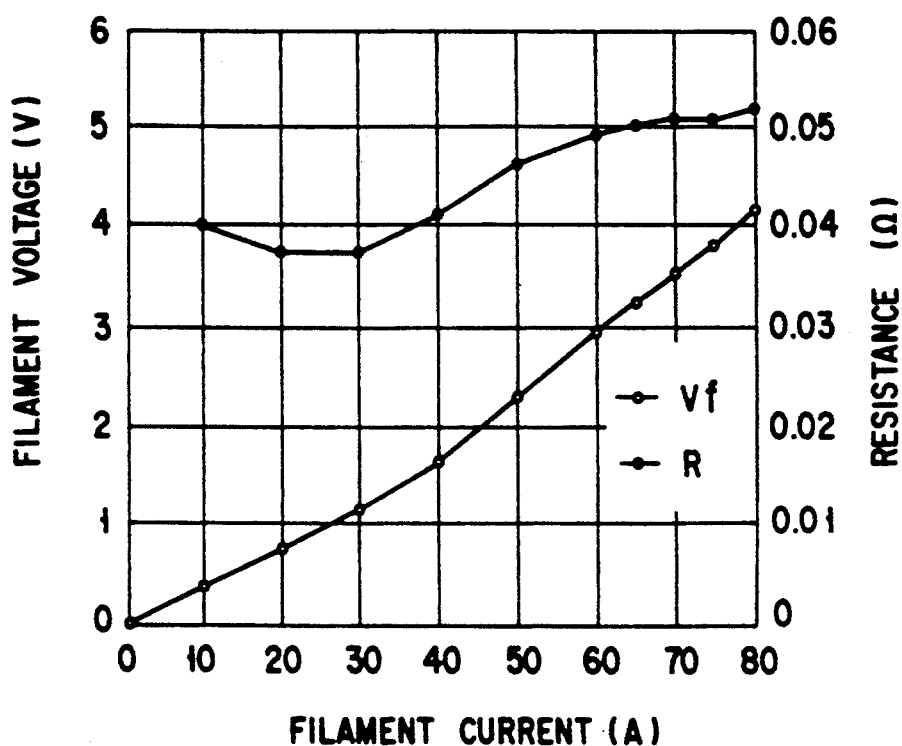
F I G. 14

ION IMPLANTATION SYSTEM USING OPTIMUM MAGNETIC FIELD FOR CONCENTRATING IONS

BACKGROUND OF THE INVENTION

1. Field of the Invention

This invention relates to a system for implanting ions into an object such as a semiconductor wafer.

2. Description of the Related Art

An ion implantation system is used to implant ions as impurities into semiconductor wafers in the process of manufacturing semiconductor devices. In such an ion implantation system, ions drawn out of an ion source unit are made to pass through a mass analyzing magnet and an acceleration tube and then implanted into a semiconductor wafer while they are scanning in X- and Y-directions through an electrostatic deflector plate to produce a given pattern. As the ion source unit of the system, a Freeman type ion source unit where source gas is turned into plasma and ions are drawn out of the plasma by means of an ion extraction electrode is popularly used.

An ion source unit of the above described type comprises an arc chamber where a magnetic field is produced to "tighten" the swell of the plasma in it so that an intense ion beam may be drawn. The intensity of magnetic field in the unit is kept constant (and not greater than 150 to 200 Gauss) regardless of the type of ions involved. Because, if the magnetic field is made too intense for the swell of the plasma to be tightened, the swell is away from the ion extraction slit of the unit and consequently the efficiency of the ion extraction operation is lowered. It is obviously conceivable, however, that keeping the intensity of magnetic field constant in the unit may be disadvantageous in some cases depending on the type of ions involved and reduce the efficiency of the ion extraction operation.

SUMMARY OF THE INVENTION

It is therefore an object of the present invention to provide an ion implantation system that can highly efficiently draw ions.

It is another object of the present invention to provide an ion implantation system that can stably implant ions into an object to be processed.

It is still another object of the present invention to provide an ion implantation system that can prolong the service life of the ion source unit it comprises.

It is still another object of the present invention to provide an ion implantation system that can efficiently start operation.

According to the invention, there is provided an ion implantation system for implanting ions into an object to be processed, comprising:

a plasma generating chamber provided with an ion drawing opening;

a material source for storing outside said plasma generating chamber a material to be turned into plasma in said plasma generating chamber;

material feeding means for feeding said material in a gas phase into said plasma generating chamber from said material source;

exciting means for making said fed material into plasma in said plasma generating chamber supporting means for supporting said object outside said plasma generating chamber;

ion extraction means disposed downstream to said opening in the ion extraction direction;

irradiating means for irradiating said object supported by said supporting means with ions drawn by the ion extraction means from said plasma generating chamber in the form of an ion beam;

an electromagnet arranged outside said plasma generating chamber to produce a magnetic field in said plasma generating chamber, said magnetic field being formed substantially perpendicular to said ion extraction direction, locally concentrating plasma in said plasma generating chamber, and thereby forming a high density region of plasma;

a power supply for applying a current to said electromagnet to excite said electromagnet;

a memory for storing data necessary to achieve an optimum magnetic field intensity specific to the type of ions to be extracted;

an input station for specifying the type of ions to be extracted; and control means for controlling the current of said power supply for said electromagnet, said control means reading data from said memory in response to the type of ions specified in said input station and thereby so controlling the current of said power supply for said electromagnet as to achieve an optimum magnetic field intensity specific to the specified type of ions.

When material gas is made into plasma in the plasma generating chamber, the generated plasma is trapped and tightened in the magnetic field to make the Larmor's radius of electrons small and produce a highly dense plasma region. Since the required level of ionization energy varies depending on the type of ions, the optimum energy level of plasma for effectively drawing ions to be implanted and hence the optimum magnetic field intensity for plasma generation vary as a function of the type of ions involved. In view of these facts, it is obvious that ions can be most effectively and efficiently drawn if the optimum magnetic field intensity specific to the type of ions to be implanted is known in advance and the magnetic field in the plasma generating chamber is set to that specific optimum magnetic intensity level. So long, in this case, as the plasma to be drawn is placed close to the ion drawing opening of the plasma generating chamber, the outer periphery of the highly dense plasma region will be located in contact with or in close vicinity of the opening even if the extent of the swell of plasma is modified. With such an arrangement, the ions in the chamber are effectively prevented from being diffused between the plasma region and the opening and consequently any possible reduction in the efficiency of ion extraction operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an exploded perspective view schematically showing part of an ion implantation system according to the invention;

FIG. 3 is a schematic diagram showing a control system for controlling the intensity of the magnetic field applied to the material gas in the ion generating chamber of the ion implantation system according to the invention;

FIG. 4 is a graph showing the relationship between the beam current and the magnetic field intensity in the ion implantation system according to the invention;

FIG. 5 is a graph showing optimum magnetic field intensities for various types of ions where the unit of FIG. 2 is used;

FIG. 6 is a sectional view schematically showing a Freeman type ion source unit that can be used for the ion implantation system according to the invention;

FIG. 14 is a graph showing the relationships respectively between the current and the voltage and between the current and the resistance of a filament to be used for the purpose of the present invention;

DETAILED DESCRIPTION OF THE PREFERRED EMBODIMENTS

FIG. 1 shows part of an ion implantation system according to the invention. The overall configuration of the system is illustrated in FIG. 8.

Figure 8:
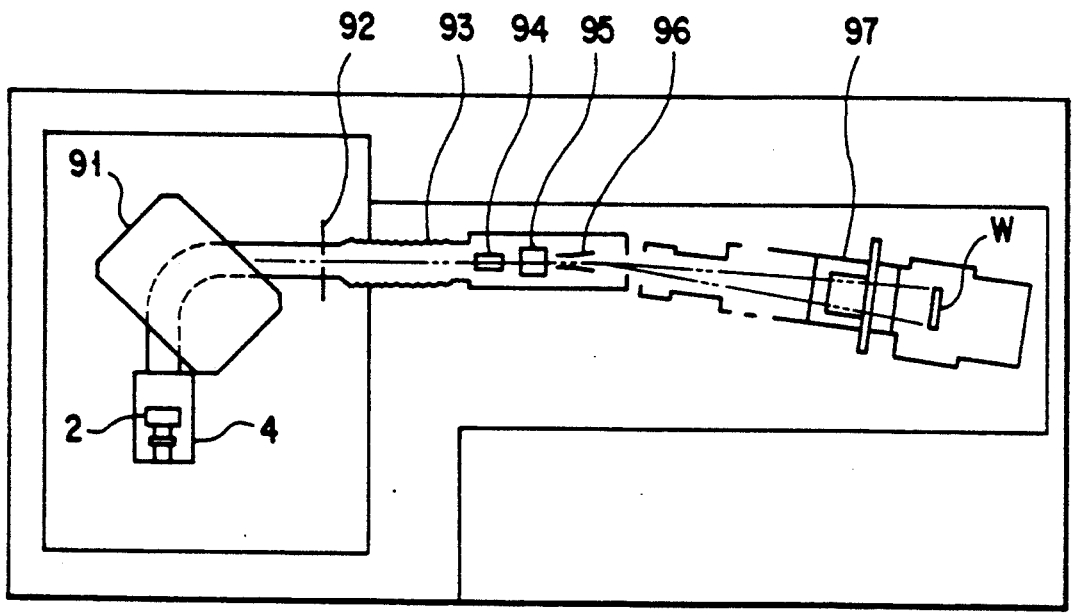
FIG. 8 is a schematic diagram showing the entire configuration of the ion implantation system according to the invention.

As shown in FIG. 8, an ion beam is drawn out of an ion source unit 2 and proceeds along an radiation path and radiated on a semiconductor wafer W disposed in a Faraday cup 97 for ion implantation. A magnet for mass analysis 91, a variable slit 92 and an acceleration tube 93 are arranged along the radiation path and an electron lens 94, a Y direction scanning electrode 95 and an X-direction scanning electrode 96 are arranged downstream to the exit of the acceleration tube 93. Thus, after passing through the magnet 91 where ions of undesired impurities are removed, the ion beam is accelerated by the acceleration tube 93 and scans through the scanning electrodes 95, 96 to produce a given pattern before it reaches the surface of the semiconductor wafer W in the Faraday cup 97.

Referring back to FIG. 1, the ion source unit 2 is rigidly fitted to a circular back plate 3 through support pillars 7 that operate as electric current conducting path with an intermediate plate 6 disposed therebetween. The back plate 3 operates as a lid for a source chamber 4 which is a vacuum container and removably and rigidly fitted to the chamber 4 by means of screws 3a. Thus, as the back plate 3 is fitted to the source chamber 4, the ion source unit 2 is automatically arranged in place in the source chamber 4.

A rectangular yoke 5 is disposed around the source chamber 4. The top and bottom members of the yoke 5 are respectively provided with projections 8 inwardly projecting from the middle thereof in a vis a-vis arrangement. Said projections 8 are provided with respective coils 9 wound therearound to form a pair of electromagnets Ma and Mb that can generate downward and upward magnetic fields inside the ion source unit 2. The coils 9 are electrically connected to a power supply 11 (FIG. 3), which will be described hereinafter.

Figure 2:
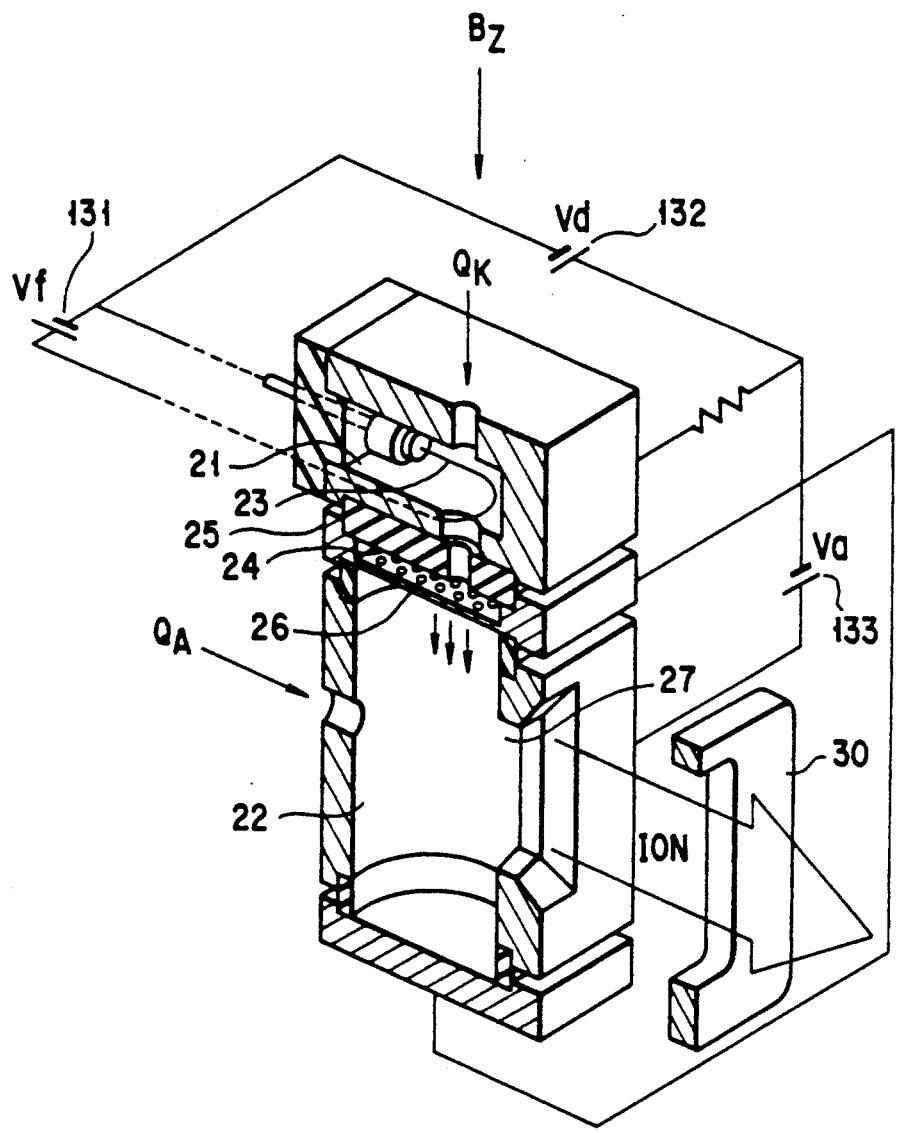
FIG. 2 is a partly sectional perspective view schematically showing an electron excitation type ion source unit that can be used for the ion implantation system according to the invention.
Figure 7:
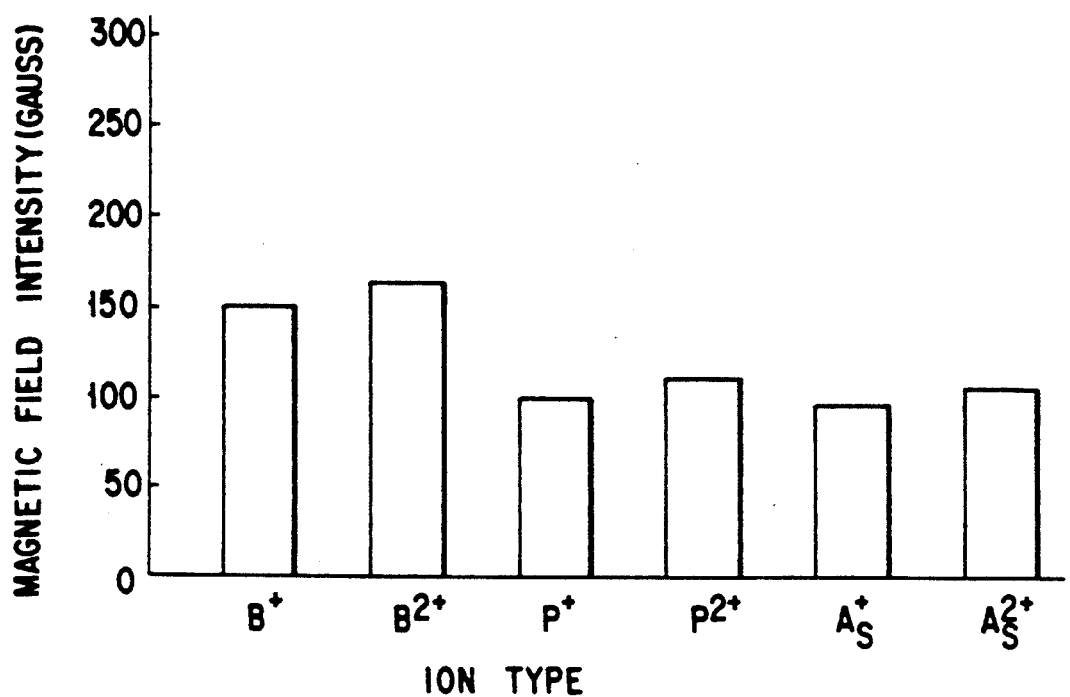
FIG. 7 is a graph showing optimum magnetic field intensities for various types of ions where the unit of FIG. 6 is used.

FIG. 2 shows an electron excitation type ion source unit that has been developed by the inventors of the invention and is differed from the Freeman type unit as referred to above. The Freeman type ion source unit will be described in greater detail later by referring to FIG. 6.

Referring to FIG. 2, the ion source unit 2 comprises a electron generating chamber 21 and an ion generating chamber 22. Electric discharge gas Qk such as argon gas is made into plasma in the electron generating chamber 21 to produce a great amount of electrons. An electron beam is drawn from the electron generating chamber 21 to collide with material gas Qa, which is then made into plasma to produce ions of the material gas Qa. The electron generating chamber 21 and the ion generating chamber 22 are respectively connected to an electric discharge gas supply pipe and a material gas supply pipe.

A U-shaped filament 23 made of a conductive material such as tungsten is disposed in the electron generating chamber 21. The opposite ends of the filament 23 are connected to a DC power supply 131 with voltage Vf while another DC power supply 132 with voltage Vd is connected between the filament 23 and an electron extraction electrode 25. The electron generating chamber 21 is held in communication with the ion generating chamber 22 by way of an opening 24 of its bottom and a number of through pores 26 formed in a plate that constitutes part of the electron extraction electrode 25. A DC power supply 133 with acceleration voltage Va is connected between the electron extraction electrode 25 and the lateral wall of the ion generating chamber 22. The DC power supplies 131 through 133 are respectively constituted by a constant voltage power source such as a switching power source.

The ion generating chamber 22 is provided on its lateral wall with a ion extraction slit 27. An ion extraction electrode 30 is disposed opposite to the slit 27 in the ion extraction direction. A voltage for accelerating the movement of ions is applied between the ion extraction electrode and the ion generating chamber 22. Ions generated in the ion generating chamber 22 are electrically attracted by the electrode 30 and drawn out through the slit 27.

FIG. 3 schematically illustrates a control system suitably configured for controlling the intensity of the magnetic field Bz applied to the material gas in the ion generating chamber 22. The electromagnets Ma and Mb are disposed respectively at the top and the bottom of the ion generating chamber 22 in such a manner that they can generate a vertically extending magnetic field Bz in the chamber 22. The intensity of the magnetic field Bz is held to a predetermined level by controlling the magnetic excitation currents fed from the power supply 11 to run through the respective coils of the electromagnets Ma and Mb.

The power supply 11 is controlled for its output voltage by means of a control unit 12 comprising an input station 13 and a memory 14. The memory 14 stores optimum magnetic field intensities that are specific to respective types of material gas and ion involved. When a particular type of ion to be used is specified by way of the input station 13, the data for the corresponding optimum magnetic field intensity are read out from the memory 14 by the control unit 12. The control unit 12 then controls the output voltage of the power source 11 and therefore the magnetic excitation currents fed to the respective electromagnets Ma and Mb, according to the data it has read out from the memory 14.

As shown in FIG. 3, a line 18 for feeding the ion generating chamber 22 with material gas Qa is connected to a plurality of material gas sources 15a through 15d containing material gas of different types. The material gas sources 15a through 15d are connected to respective MFCs (mass flow controllers) 16a through 16d and solenoid valves 17a through 17d. The operation of opening and closing any of the solenoid valves 17a through 17d is controlled by the control unit 12. Once the type of ion to be used for an operation is specified by way of the input station 13, the control unit 12 opens only the solenoid valve for the gas source corresponding to the specified ion.

Now, the operation of the above described embodiment of ion implantation system will be described. Firstly, the back plate 3 is fitted to the source chamber 4 so that the ion source unit 2 is set in position in the source chamber 4. Electric discharge gas Qk such as argon gas is introduced into the electron generating chamber 21 of the ion source unit 2 and voltages Vf and Vd are applied respectively between the opposite ends of the filament 23 and between the filament 23 and the electrode 25 to give rise to electric discharges which makes the argon gas into plasma. Electrons e in the argon gas plasma are then drawn as an electron beam into the ion generating chamber 22 while acceleration voltage Va is applied to the electron extraction electrode 25 and the lateral wall of the ion generating chamber 22.

Meanwhile, material gas Qa is introduced in the ion generating chamber 22 and made into plasma as electrons e drawn out of the electron generating chamber 21 collide with molecules of the material gas. The plasma P of the material gas is then trapped in and tightened by the magnetic field Bz generated in the ion generating chamber 22 along the direction as indicated in FIGS. 2 and 3 by means of the electromagnets Ma and Mb. Thus, these arrangement makes Larmor's radius of electrons small and produces a highly dense plasma region P. A beam of plasma ions is then drawn out of the plasma region P through the slit 27 by the ion extraction electrode 30.

The intensity of the magnetic field Bz is set to an optimum level according to the type of ions to be implanted into the wafer. Here, the optimum intensity means the magnetic field intensity at which the beam current of ions of the specific type is maximized if measured by a Faraday cup arranged on the target side (and designated by 97 in FIG. 8). FIG. 4 graphically shows the relationship between the beam current of $B^+$ ions and the magnetic field intensity in the embodiment of ion implantation system under consideration. The beam current reaches a maximum when the magnetic field intensity is approximately 150 gauss, meaning that the electrical current by the power source 11 needs to be set to a value that generates a magnetic field intensity of this level.

FIG. 5 is a graph showing optimum magnetic field intensities for various types of ions, such as $B^+$, $B^{2+}$ and $P^+$, when the unit of FIG. 2 is used. Data representing the optimum magnetic field intensities for various types of ions are determined in advance in the above described manner and stored in the memory 14 of the embodiment. When a particular type of ion or material gas is specified by way of the input station 13, the control unit 12 so controls the current applied by the power supply 11 as to optimize the magnetic field intensity to be generated.

An electron excitation type ion source unit 2 as described above can tighten the swell of plasma by far more effectively than a Freeman type ion source unit as will be described in detail hereinafter. This is because an ion source unit 2 of the type under consideration is designed to cause an electron beam introduced from the electron generating chamber 21 to collide with molecules of the material gas so that plasma may be generated in close vicinity of the slit 27. Such an effect can be realized by disposing the opening 24 through which the electron beam is drawn out as well as the magnet for generating a magnetic field close to the slit 27.

More specifically, when plasma is generated near the slit 27, the generated plasma can be strongly tightened to consequently reduce any possible deflection of the optical axis of the produced ion beam and improve the efficiency with which the ion beam is drawn out. While a high magnetic field intensity may be advantageous for drawing out an ion beam, an enhanced magnetic field intensity does not necessarily guarantee a maximum efficiency with which the beam of ions of a given type is drawn out because the energy level required for ionization differs depending on the type of ions involved and so does the optimum magnetic field intensity. For example, a magnetic field intensity higher than the optimum magnetic field intensity for obtaining $B^+$ ions is required to produce $B^{2+}$ ions and, therefore, an inadequately high magnetic field intensity can deteriorate the efficiency of drawing out $B^+$ ions. In short, the optimum magnetic field intensity for a specific type of ions relates to the shape of the high density plasma region, the ionization energy level and other factors and, therefore, it has significant implications to control the magnetic field intensity.

Since a pair of coils are vertically disposed vis-a-vis above and below the ion source unit 2 in the embodiment of FIGS. 1 and 3, the magnetic field generated by them shows a high degree of parallelism, which also serves to raise the efficiency of ion extraction operation. It should be noted, however, that the present invention is not limited to this mode of coil arrangement and magnetic field generating means comprising a U-shaped yoke and, for instance, a coil disposed at the middle thereof may alternatively be used.

For the purpose of the present invention, a known Freeman type ion source unit may be used in place of an electron excitation type ion source unit as illustrated in FIG. 2.

FIG. 6 is a schematic diagram of a Freeman type ion source unit 80. The ion source unit comprises arc chamber 81 made of a conductive material and provided with a liner 82 of a conductive ceramic material. A pair of support plugs 83a and 83b made of an insulating material are arranged respectively through the top and the bottom of the chamber 81 without damaging the hermetically sealed condition of the chamber 81. A rod-shaped filament 84 vertically passes through the chamber 81 and is rigidly held by the support plugs 83a, 83b.

A DC power supply 87 with voltage V1 is connected to the opposite ends of the filament 84, while another DC power supply 88 with voltage V2 is connected to the chamber 81 which operates as an anode electrode and the negative end of the filament 84. Magnetic field generating means, such as the pair of electromagnets Ma and Mb illustrated in FIG. 1, is disposed outside the chamber 81 to generate a magnetic field Bz in the chamber 81.

As material gas such as BF3 is fed into the chamber 81 through a gas input port 85 while voltages V1 and V2 are applied and a magnetic field Bz is generated in the chamber 81, the material gas is made into plasma. The plasma region P produced in the chamber 81 is then very tightened and highly dense around the filament 84 by the magnetic field Bz. Ions in the plasma region P are drawn out of the chamber through an ion extraction slit 86 by an ion extraction electrode (similar to the ion extraction electrode 30 of FIG. 2).

FIG. 6 is a graph showing optimum magnetic field intensities for various types of ions, such as $B^+$, $B^{2+}$ and $P^+$, when the Freeman type ion source unit 80 of FIG. 6 is used. Data representing the optimum magnetic field intensities for various types of ions are determined in advance in the above described manner and stored in the memory 14 of the embodiment. When a particular type of ion or material gas is specified by way of the input station 13, the control unit 12 so controls the current applied by the power supply 11 as to optimize the magnetic field intensity to be generated.

Care needs to be taken about a Freeman type ion source unit 80, however, since if the magnetic field is excessively intensified to tighten the swell of plasma too much, the efficiency of ion drawing operation is undesirably reduced with this type of ion source unit. This is because the outer periphery of the high density plasma region P is moved away from the slit 86 if the magnetic field intensity is made too high. The filament 84 cannot be arranged so close to the slit 86 in the ion source unit 80 of the Freeman type, on the contrary to the ion source unit 2 of the electron excitation type. Therefore, a permissible upper limit needs to be reminded for each type of ions, said permissible upper limit normally being found between 150 and 200 gauss.

FIGS. 9 through 13 illustrate different modified embodiments of ion implantation system of the invention. Any of these modifications may be additionally used with one of the above described embodiments by referring to FIGS. 1 through 8.

Figure 9:
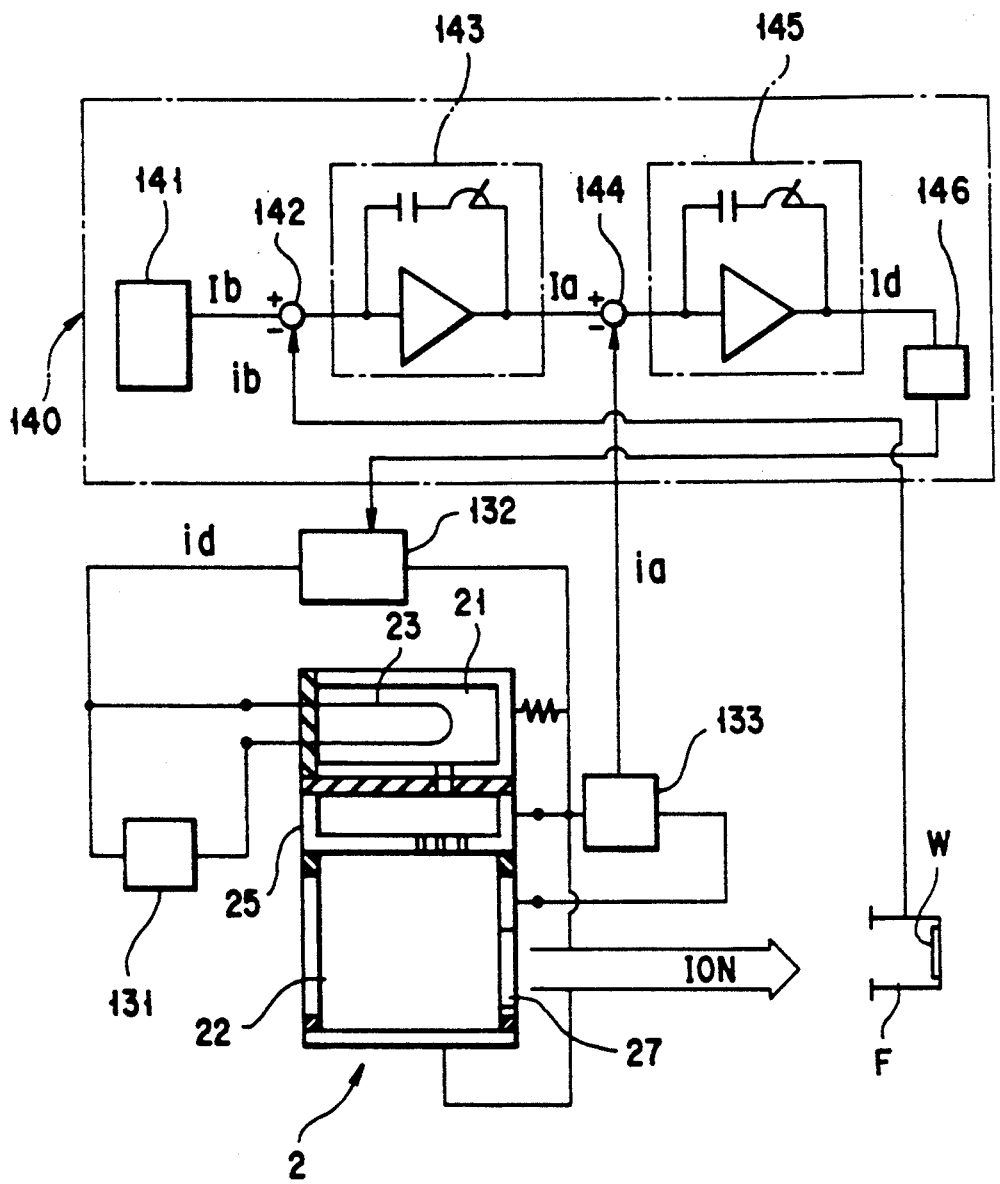
FIG. 9 is a schematic diagram showing a modified embodiment of ion implantation system according to the invention.

The embodiment ion implantation system illustrated in FIG. 9 comprises a control unit designed to constantly optimize the level of the electric current generated by the ion beam, which will be hereinafter referred to simply as the ion beam current or beam current. It further comprises a Faraday cup F (designated by 97 in FIG. 8) which is disposed on the side of the semiconductor wafer W, or the target of the beam current, and operates as an electric current detector for detecting the beam current.

The control unit 140 comprises a beam current specifying section 141, a matching circuit (comparison circuit) 142, an arithmetic section 143, a matching circuit 144, an arithmetic section 145, a drive circuit 146. The beam current specifying section 141 specifies a target level for the ion beam current of a particular type of ions to be radiated by the ion source unit 2. The matching circuit 142 determines the deviation of the ion beam current value ib detected by the Faraday cup F from the target current value Ib specified by the beam current specifying section 141. The arithmetic section 143 carries out a PID (proportional integral and derivative) operation on the deviation determined by the matching circuit 142 to calculate a command value Ia for the electron beam current (to flow into the ion generating chamber 22). The matching circuit 144 compares the output signal Ia of the arithmetic section 143 and the electron beam current value ia detected, for example, by an current detection resistor built in the Dc power supply 133. The arithmetic section 145 carries out a PID operation on the deviation determined by the matching circuit 144 to determine a command value Id for the discharge current to flow in the DC power supply 132. The drive circuit 146 finally controls the DC power supply 132, which may typically constitute a constant current power source such as a switching power source, for supplying a discharge current according to the output signal of the arithmetic section 145.

The embodiment of FIG. 9 operates in a manner as described below.

The beam current value ib of the ion beam radiated onto the semiconductor wafer W in a manner as described above is detected by the Faraday cup F and the detected current value ib is received by the control unit 140. The received current value ib is then compared with the beam current target value Ib by the matching circuit 142 and the arithmetic section 143 carries out a PID operation on the difference between the two values to produce a command value Ia for the electron beam current. The command value is then compared with the detected value ia of the electron beam current by the matching circuit 144 and the arithmetic section 145 performs a PID operation on the difference between the two values to produce a command value Id, while the drive section 146 so controls the power supply 132 as to make the discharge current value id to agree with the command value Id.

As the discharge current id is controlled to stabilize the electron beam current ia, the ion beam current ib is properly controlled. Thus, if the level of the electron beam current ia comes to change as a result of wear, for instance, of the electron extraction electrode 25, the command value for the discharge current is made to change in order to accommodate the change in the level of the electron beam current so that the ion beam current ib is constantly held to an appropriate level and consequently the semiconductor wafer W can be implanted with ions of the given type to an evenly distributed concentration regardless of the change in the level of the electron beam current ia.

Figure 10:
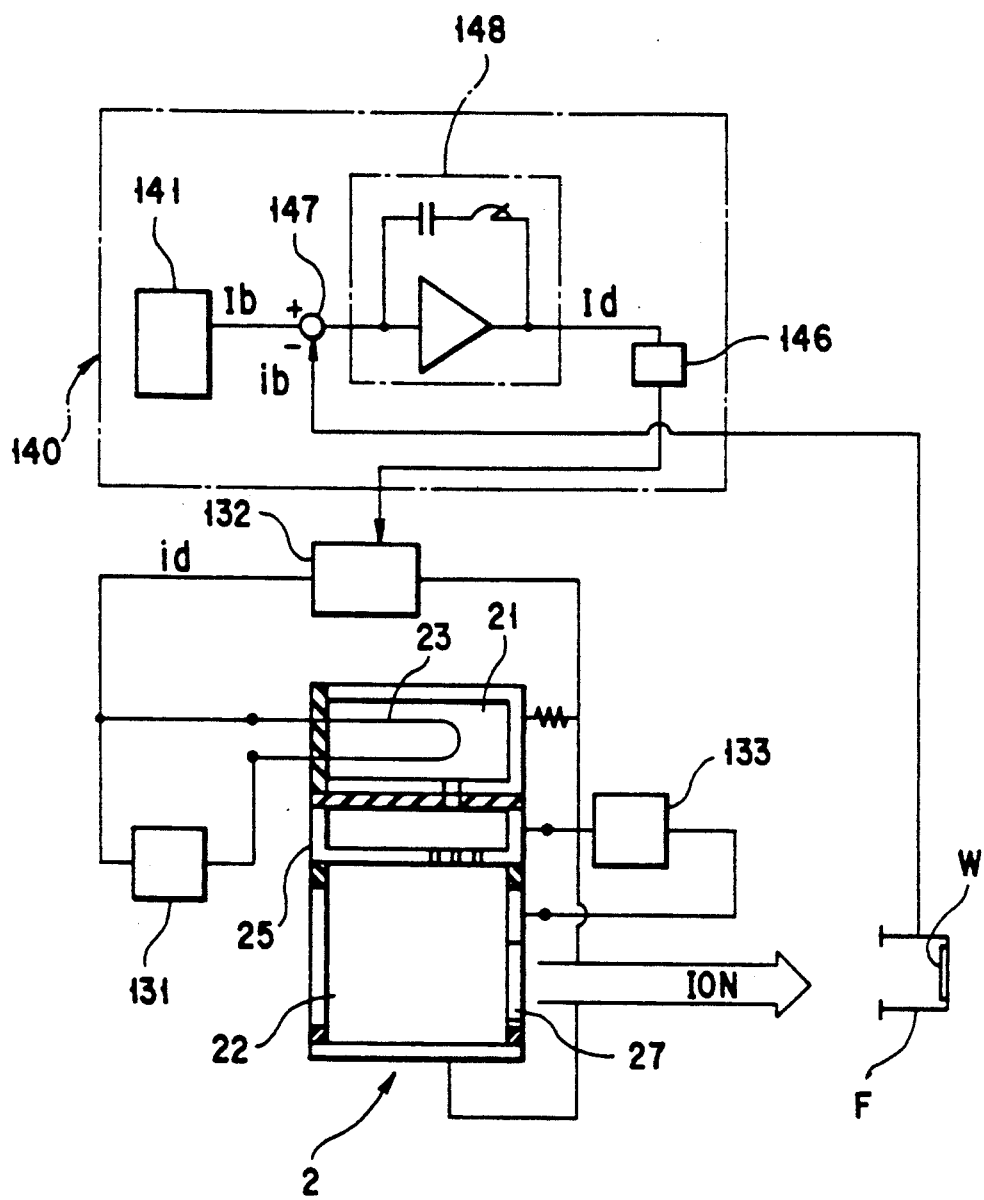
FIG. 10 is a schematic diagram showing another modified embodiment of ion implantation system according to the invention.

Referring to FIG. 10, the control unit 140 of an embodiment shown therein comprises a specifying section 141, a matching circuit 147, an arithmetic section 148 and a drive circuit 146 of a type as described above by referring to FIG. 9. The specifying section 141 specifies a target level Ib for the ion beam current. The matching circuit 147 determines the deviation of the detected ion beam current value ib from the target current value Ib specified by the specifying section 141. The arithmetic section 148 performs a PID operation on the deviation determined by the matching circuit 147 to calculate a command value Id for the discharge current. Thus, this embodiment differs from the embodiment of FIG. 9 in that the result of a PID operation carried out on the difference between the target value Ib and the detected value ib for the ion beam current is used as the command value for the discharge current.

In this embodiment, the discharge current id is so controlled as to stabilize the ion beam current ib. Thus, the ion beam current is constantly and stably maintained to an appropriate level as in the case of the embodiment of FIG. 9. On the other hand, since the control unit of this embodiment does not comprise a circuit for controlling the discharge current in order to stabilize the electron beam current ia, specifically the matching circuit 144 and the arithmetic section 145, it has a simplified configuration as compared with that of the control unit of the preceding embodiment.

The control unit of the embodiment of FIG. 10 is compatible with a Freeman type ion source unit. While the ion beam current can be easily and stably controlled by the use of PID operation, it may alternatively and suitably controlled by other appropriate technique.

Figure 11:
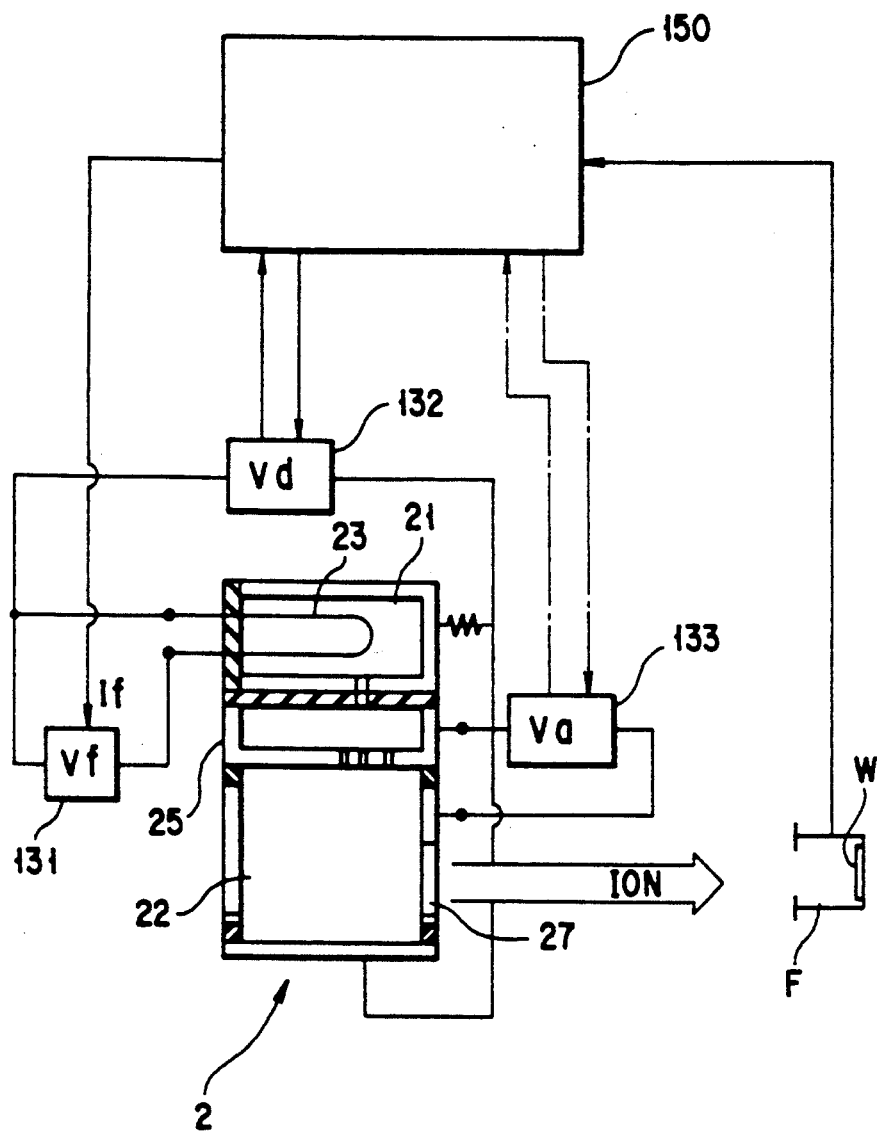
FIG. 11 is a schematic diagram showing still another modified embodiment of ion implantation system according to the invention.

Referring to FIG. 11, the control unit 150 of an embodiment shown therein stores a minimum value for the discharge voltage Vd that can stabilize the electric discharge for the beam current and therefore the plasma in the electron generating chamber 21. The control unit 150 also controls the filament current If so as to stabilize the discharge voltage Vd. In order to obtain a desired level for the ion beam current, the flow rate of discharge gas Qk, that of material gas Qa and the current (source magnet current) for magnetically exciting the electromagnets to produce a magnetic field Bz need to be appropriately specified. The discharge voltage Vd may have a specific range that can stabilize the electric discharge for each different set of parameters and the electric discharge can become unstable when the discharge voltage Vd is deviated from that range.

In this embodiment, a range of discharge voltage Vd that can stabilize the discharge or the ion beam current is determined in advance for each desired level of ion beam current. The minimum value of each determined range is stored in a memory of the control unit 150. The control unit 150 then specifies the minimum value for the voltage (discharge voltage) of the DC power supply 132 in response to the actual value of the discharge voltage Vd which is detected typically for every 1 to 2 hours.

In this embodiment, the discharge voltage Vd is periodically updated to show optimum level while ions of a specific type are being implanted into the semiconductor wafer W so that the wear of the filament 23 is minimized and, at the same time, the ion beam current is maintained to a desired and stable level. With such an arrangement, the filament 23 and, therefore, the entire ion source unit can enjoy a prolonged service life. While the discharge voltage Vd may well be updated for every 1 to 2 hours under normal conditions because it does not show any remarkably fluctuations once it is set to a correct level, it may be so arranged, if desired, as to be updated for a shorter period of time or on an irregular basis. In place of determining appropriate levels in advance for the discharge voltage Vd, an appropriate level may be determined by the control unit 150 immediately before the operation of updating the specified discharge voltage Vd.

The control unit 150 can additionally be provided with a feature of specifying a minimum value for the acceleration voltage Va for each desired level of the ion beam current within a range where the ion beam current is found stable. With such a feature, the control unit 150 reads the detected acceleration voltage Va as indicated by chain lines in FIG. 11 to control it. If such is the case, a data base will need to be prepared in advance by gathering data in order to find out to what extent the acceleration voltage Va can be made low and the specified acceleration voltage will be updated periodically for every 1 to 2 hours. This feature of controlling the acceleration voltage Va may be used solely or in combination with the above described feature of controlling the discharge voltage Vd.

It will be understood that installation of the feature of controlling the acceleration voltage Va can significantly prolong the service life of the electron extraction electrode 25 and consequently that of the ion source unit because the acceleration voltage is set to the predetermined lowest level periodically or irregularly. It may be needless to say that the discharge voltage Vd and the acceleration voltage Va may respectively be set to appropriate levels that are found above the lowest levels within the determined ranges as precautionary measures.

The control unit of the embodiment of FIG. 11 is compatible with a Freeman type ion source unit.

Figure 12:
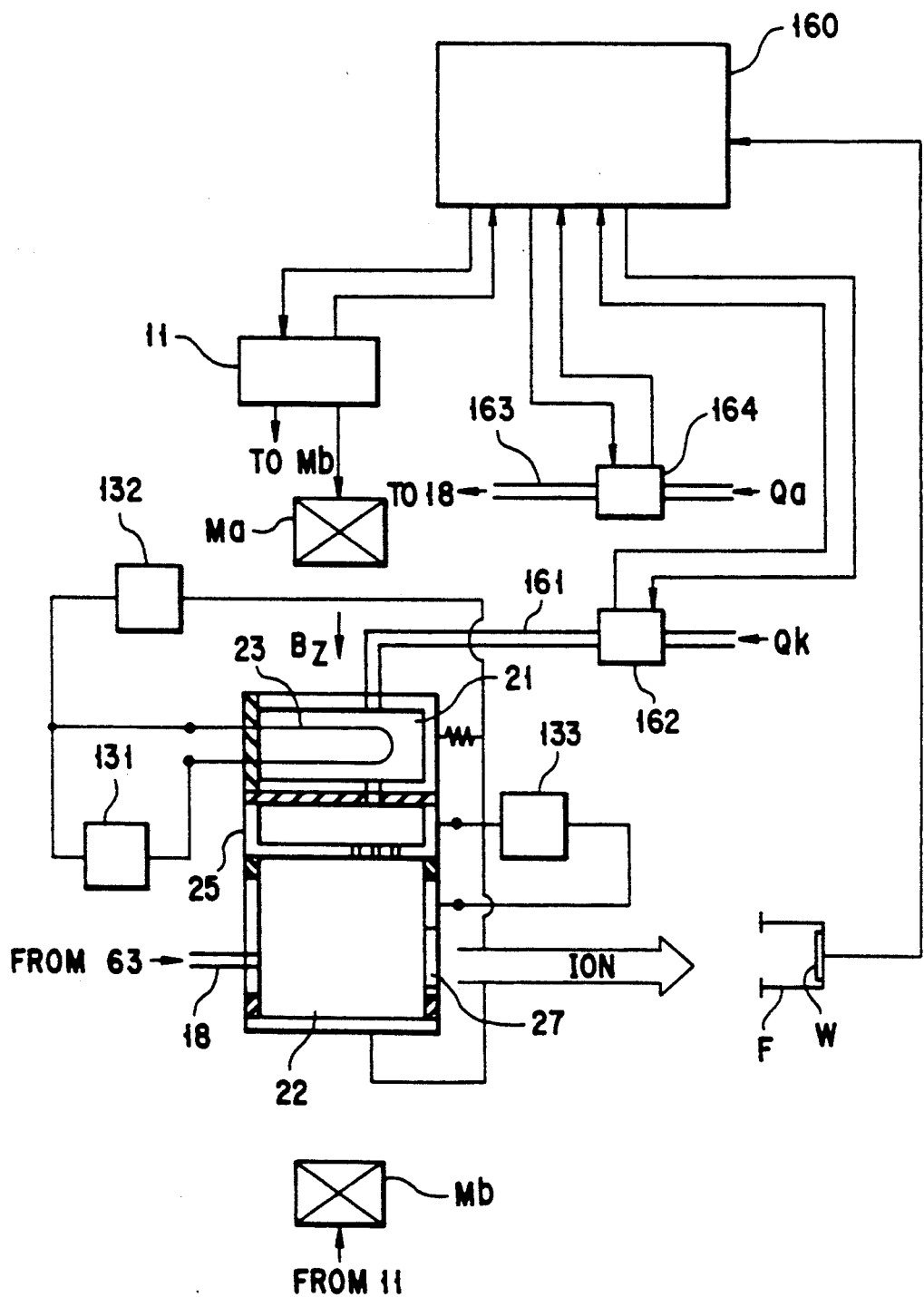
FIG. 12 is a schematic diagram showing still another modified embodiment of ion implantation system according to the invention.

An embodiment shown in FIG. 12 is provided with a control unit 160 that specifies optimum operating conditions to minimize the beam noise level of the ion beam current. The control unit 160 comprises a memory for storing data representing operating conditions that can minimize the beam noise level. The control unit 160 reads the gas flow rate detected by the gas flow rate control device 162 of the discharge gas supply pipe 161 and the gas flow rate detected by the gas flow rate control device 164 of the material gas supply pipe 163 and transmits gas flow rate control signals respectively to the control devices 162 and 164. The control unit 160 also reads the detected level of the electric current supplied to the electromagnets Ma and Mb from the power supply 11 to generate a magnetic field Bz and transmits a current control signal to the power supply 11. The control unit 160 additionally reads the detected level of the beam current from the Faraday cup F.

Thus, the control unit 160 of the above described embodiment preliminary collects data on the flow rate of electric discharge gas Qk, the flow rate of material gas Qa and the intensity of magnetic field Bz (or the level of the electric current from the power supply 11 for magnetic excitation). The collected data are stored in the memory of the control unit 160, which then determines respective correct values. The control unit 160 thereafter specifies the correct values respectively for the flow rate of electric discharge gas Qk, the flow rate of material gas Qa and the electric current level for magnetic excitation.

The collected data may be alternatively utilized to periodically modify each of the operating conditions in order to determine a set of conditions on the basis of the detected level of the beam current from the Faraday cup F that can minimize the beam noise level. In general, the greater the flow rate of electric discharge gas Qk and that of material gas Qa, the lower is the beam noise level. Conversely, the smaller the flow rate of electric discharge gas Qk and that of material gas Qa, the higher will be the beam noise level. As for the magnetic field Bz, the beam nose level will be raised if the intensity of the magnetic field Bz is too high or too low.

A noisy beam current means an unevenly distribution of ion concentration of implanted ions on the surface of the semiconductor wafer W. With the above described embodiment, a set of values are specified for Qk, Qa and Bz to minimize the beam noise level and ensure an evenly distributed ion concentration of implanted ions.

The control unit 160 of the embodiment of FIG. 12 is compatible with a Freeman type ion source unit. If a Freeman type ion source unit is installed, only the flow rate of material gas and the intensity of magnetic field are so selected as to minimize the beam noise level.

Figure 13:
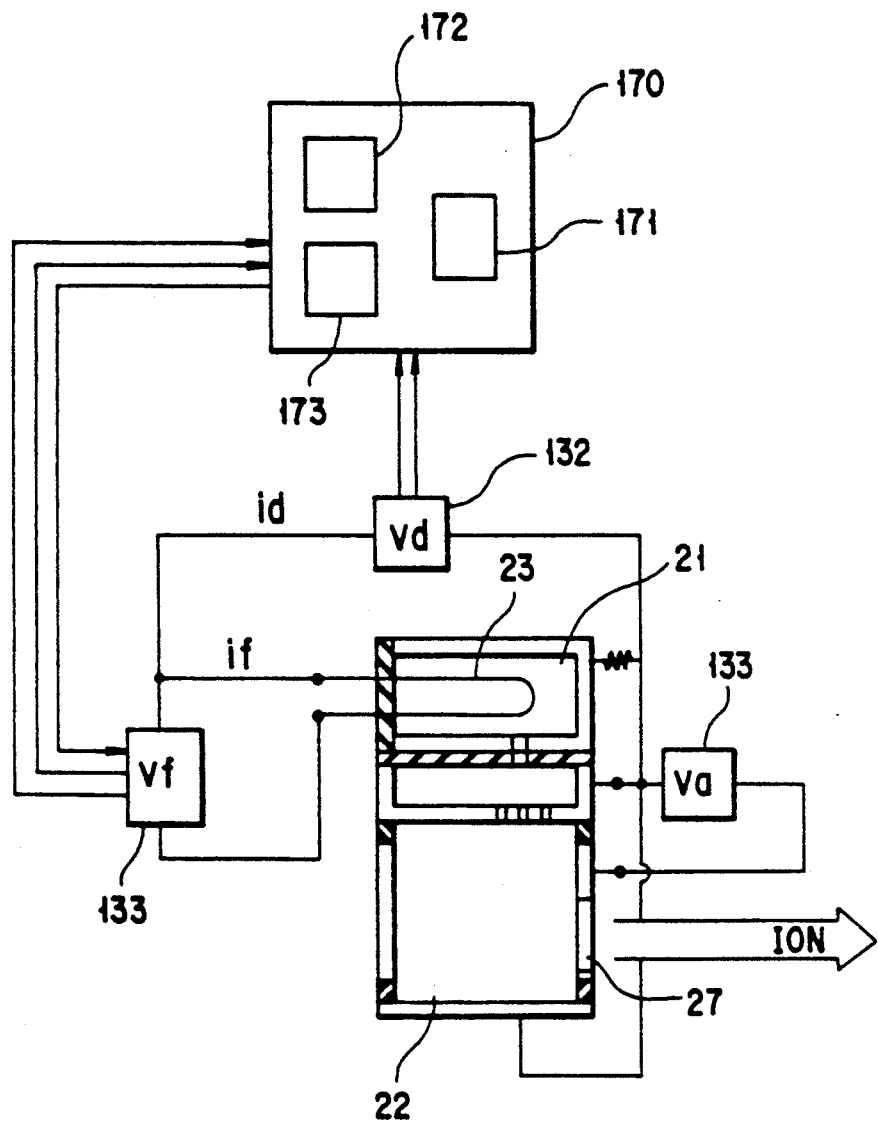
FIG. 13 is a schematic diagram showing still another modified embodiment of ion implantation system according to the invention.

In an embodiment shown in FIG. 13, a control unit 170 is designed to determine the extent of wear of the filament 23 and control the filament current as a function of the determined extent of wear. The control unit 170 comprises a memory, a determining section 172 and an electric current control section 173. The memory 171 stores data representing the relationship between the filament current if and the filament voltage Vf supplied to the filament 23 by the DC power supply 131. The determining section 172 determines the extent to which the filament 23 has been worn as well as the level of filament current if at which plasma begins to be generated (hereinafter referred to as "ignition current value") and the upper limits for if and Vf not to break the filament 23 on the basis of the relationship stored in the memory 171. The current control section 173 sets an initial value and an upper limit value for the filament current if and also controls it after plasma is generated on the basis of the output signal of the determining section 172. The control unit 170 also reads data representing the discharge current id and the discharge voltage Vd supplied from the DC power supply 131.

With this embodiment, data representing the relationship between the filament current if and the filament voltage Vf are stored in the memory 171 before the activation of the ion source unit 2 and an ignition current value is determined for if by the determining section 172. FIG. 14 illustrates the relationship between if and Vd as well as the relationship between if and R (the resistance of the filament) obtained in an experiment using the embodiment. In the graph of FIG. 14, the abscissa represents if and the left ordinate represents Vf while the right ordinate represents the resistance of the filament 23.

It is seen from the graph that the resistance of the filament reaches a saturated state when if approaches 70A, suggesting that plasma can be ignited under these conditions. As the degree of wear of the filament 23 progresses, the level of if at which the resistance reaches a saturated state goes down. So the extent of wear of the filament 23 and hence the ignition current value of if can be determined from this relationship.

The control unit 170 of the above embodiment operates in a manner as described below. Firstly, the level of the current for magnetically exciting the electromagnets to generate a magnetic field, the flow rate of discharge gas, the flow rate of material gas and the level of the current id from the DC power supply 132 are set to their initial values. Thereafter, if and Vf are measured to determine the degree of wear of the filament 23 and update the level of the current for magnetically exciting the electromagnets. Then, the current control section 173 sets an appropriate ignition current value for if and increases the current if at a given rate until the ion source unit is activated. Once plasma is generated, the rate, at which if is increased, is reduced and then the rate is further reduced when the discharge current id reaches a predetermined level and the discharge voltage Vd shows a tendency of going down, so that the discharge voltage Vd is maintained to an optimum level.

The level of if may be controlled by using PID operations that are carried out on detected values of id and Vd or, alternatively, by a fuzzy rule defined by incorporating id and Vd in conditional formulas. Since upper limits are given to if and Vf as a function of the degree of wear of the filament 23 and they are held to the respective upper limit values once they reach that levels, the filament 23 is protected against breakage that may occur when if is inadvertently raised.

Since the ion source unit is activated while the filament current is being strictly controlled in relation to the degree of wear of the filament, the ion source unit can start and keep its operation of generating plasma effectively and efficiently regardless of its operating conditions and without fear of breaking the filament. This means that the rise time required for the ion source unit can be significantly reduced if compared with a case where if needs to be manually and gradually raised from zero in order to prevent the filament from being broken.

The timing of detecting the degree of wear of the filament may be arbitrarily selected and, if a vacuum condition has not been broken, since the last operation of detecting the degree of wear of the filament, additional operations to update the data on the degree of wear of the filament may be omitted to boost the overall efficiency of operation.

The control unit 170 of the embodiment of FIG. 13 is compatible with a Freeman type ion source unit.

Figure 15:
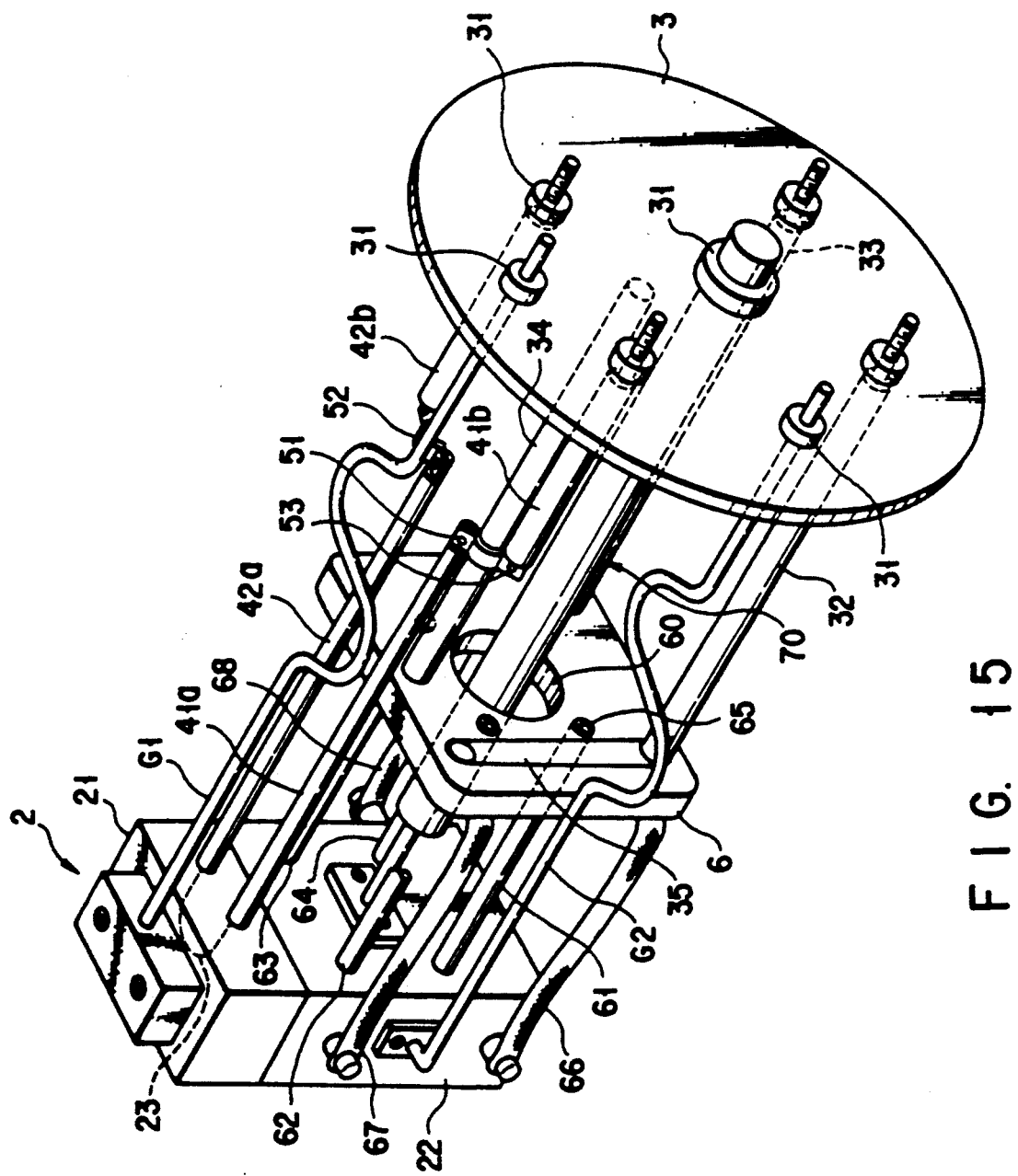
FIG. 15 is a detailed perspective view showing an arrangement of an ion source unit, a back plate and an intermediate plate as illustrated in FIG. 1.

FIG. 15 is a detailed perspective view showing an arrangement of an ion source unit 2, a back plate 3 and an intermediate plate 6 as illustrated in FIG. 1.

The opposite ends of the filament 23 of the ion source unit 2 are respectively connected to ends of a pair of conductive rods 41a and 42a, forming a path of electric current. The conductive rods 41a and 42a extend in parallel from the ion source unit to the back plate 3. The other ends of the rods are respectively connected to ends of another pair of conductive rods 41b and 42b by way of respective connecting members 51 and 52, said rods 41b and 42b being separated from each other by a distance greater than the distance between the conductive rods 41a and 42a. The remaining ends of the conductive rods 41b and 42b are secured to the back plate 3 by screws with a sealing member 31 interposed therebetween and connected to a power supply line (not shown).

The conductive rods 41a and 42a and conductive rods 41b and 42b have flat end portions and respectively connected to connecting members 51 and 52 by screws 53 at the flat end portions. Each of the connecting members 51, 52 is prepared by bending a strip of an anti-corrosive material such as silver at the middle to form a U-shape and deformable in the longitudinal direction. Thus, if the U-shaped filament 23 is heated and extends by thermal expansion to push the conductive rods 41a and 42a further apart, areas of the conductive rods 41a, 42a, 41b and 42b connected to the connecting members 51 and 52 are relatively free from an increase in the load, meaning that screws are less liable to be damaged and the entire assembly can be serviced with ease.

The intermediate plate 6 disposed between the ion source unit and the back plate 3 is made of an insulating material. The intermediate plate 6 is rectangular and so dimensioned as not to interfere with the conductive rods 41a and 42a. Additionally, it has a circular opening 60 at the center.

The ion source unit 2 is provided with four support pillars 61 through 64 typically made of stainless steel and arranged in parallel, upper two pillars and lower two pillars. The remote ends of the support pillars 61 through 64 are removably secured to the intermediate plate 6 by screws 65. Conductive straps 66 through 68 are connected to lateral sides of the ion source unit 2. The remote ends of the conductive straps 66 through 68 are also secured to the intermediate plate 6 by screws (not shown).

Three support pillars 32 through 34 are connected between the back plate 3 and the intermediate plate 6 to provide conductive paths. They are secured to the back plate 3 at respective ends by screws with a sealing member 31 interposed therebetween and further connected to a power supply line (not shown). The support pillar 32 is electrically connected to the conductive strap 66 at the intermediate plate 6 and physically secured thereto. The support pillar 32 and the conductive strap 67 are electrically connected to each other by way of a strip-shaped connector plate 35 adhering to the intermediate plate 6 on the side facing the back plate 3. The support pillar 33 is electrically connected to the support pillar 63 at the intermediate plate 6 by way of a similar connector plate (not shown) to provide a conductive path. The support pillar 34 is also electrically connected to the conductive strap 68 at the intermediate plate 6.

An electric discharge gas supply pipe G1 for supplying electric discharge gas such as argon gas is connected at an end thereof to the top of the electron generating chamber 21 of the ion source unit 2. The supply pipe G1 is bent at the middle to form an S-shape and the other end is airtightly secured to the back plate 3 with an sealing member 31 interposed therebetween. A material gas supply pipe G2 is connected to a gas inlet port located at a lateral side of the ion generating chamber 22 of the ion source unit 2 in order to supply material gas from a gas source. The supply pipe G2 is also bent at the middle to form an S-shape and the other end is airtightly connected to the back plate 3 with the sealing member 31 interposed therebetween. Since the pipes G1 and G2 have the bent portion of S-shape, they can absorb thermal extension when heated.

Figure 16:
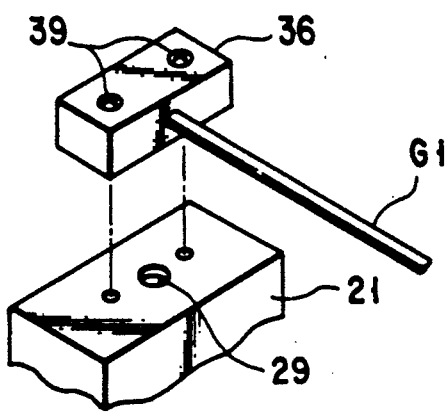
FIG. 16 is an exploded perspective view showing the connected portion of an electric discharge gas supply pipe in the ion source unit of FIG. 2.
Figure 17:
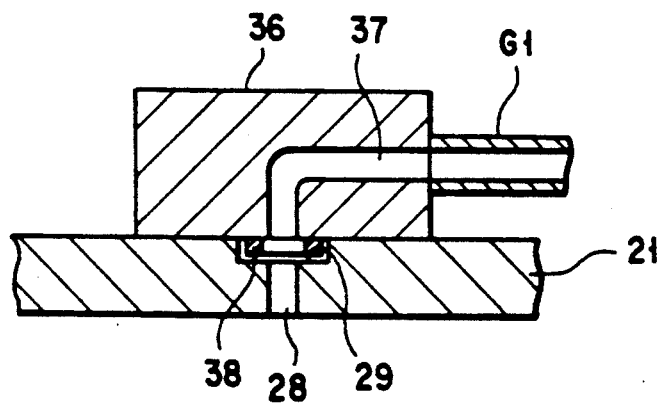
FIG. 17 is a sectional view showing the connected portion of an electric discharge gas supply pipe in the ion source unit of FIG. 2.

FIGS. 16 and 17 are views showing how the electron generating chamber 21 and the supply pipe G1 are connected with each other. The front end of the gas supply pipe G1 is connected to a lateral side of a rectangular connecting member 36 such that it is kept in communication with the electron generating chamber 21 by way of a gas guide path 37 formed in the connecting member 36 and a hole 28 formed through the top of the electron generating chamber 21. The connecting member 36 is provided at the bottom with an annular projection 38 that surrounds the open end of the gas guide path 37. The annular projection 38 is held in engagement with an engaging bore 2 formed at the top of the electron generating chamber 21 such that the connecting member 36 is properly aligned with the electron generating chamber 21. The connecting member 36 is removably secured to the top of the electron generating chamber 21 by screws 39.

The bottom surface of the connecting member 36, the outer peripheral surface of the annular projection 38, the top surface of the electron generating chamber 21 and the inner peripheral surface of the engaging hole 29 are mirror finished in order for the bottom surface of the connecting member 36 and the top surface of the electron generating chamber 21 to be airtightly connected with each other to prevent leakage of discharge gas.

The gas inlet port disposed at the back side of the ion generating chamber 22 is connected to a vaporizer 70 containing a solid and highly toxic material such as As. The vaporizer 7 passes through the opening 60 of the intermediate plate 6. The remaining ends of the material supply pipe G2 and the vaporizer 7 are airtightly secured to the back plate 3 with the sealing member 31 interposed therebetween.

Figure 18:
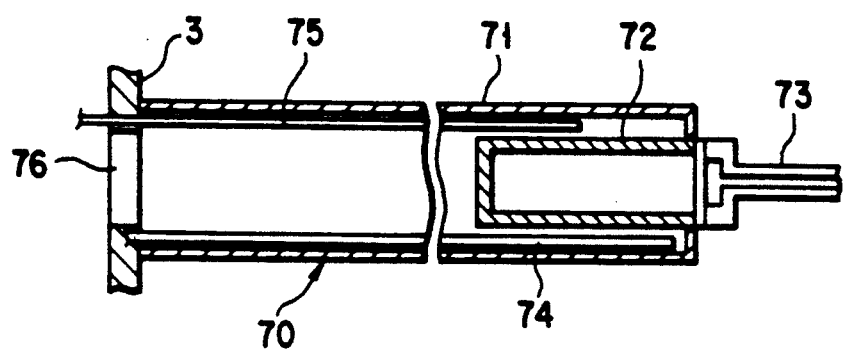
FIG. 18 is a sectional view showing the inside of a vaporizer to be incorporated in the arrangement of FIG. 15.

As illustrated in FIG. 18, vaporizer 70 comprises a hollow cylindrical body 71, which is provided at the front end with a melting pot 72 for containing a solid material such as As from which material gas is produced. The melting pot 72 is introduced into the hollow cylindrical body 71 through an opening 76 located at the end of the cylindrical body 71 close to the back plate 3 and thereafter the opening 76 is closed. The opposite end of the cylindrical body 71 is connected to a nozzle 73, which is connected to the ion source unit 2. A heating device such as an electric heater 74 and a temperature sensor 75 are also introduced into the cylindrical body 71 from its end close to the back plate 3 and arranged close to the outer peripheral surface of the melting pot 72. The heater 74 and the temperature sensor 75 are connected to a control device by way of lead wires.

An electron excitation type ion source unit 2 having a back plate 3 as illustrated in FIGS. 15 through 18 operates in a manner as described below.

The inner pressure of the source chamber 40 (see FIG. 1) equipped with an ion source unit 2 is reduced to a given vacuum level by means of a vacuum pump. Then, a given voltage is applied to the ion source unit 2 by way of the conductive rods 41a, 42a, 41b and 42b and the support pillars 32 through 34 and other related components as illustrated in FIG. 2. Discharge gas such as argon gas is introduced into the electron generating chamber 21 by way of the supply pipe G1 at a flow rate typically above 0.05 SCCM. As the filament is heated to between 1,000° C. and 3,000° C. by voltage Vf and begins to emit thermoelectrons, an electric discharge is caused by discharge voltage Vd and argon gas is made into plasma.

The heater 74 arranged in the vaporizer 70 is turned off when material gas is fed in through the supply pipe G2 in order to prevent the solid material stored inside from being sublimited. As the supply pipe G2 is opened, material gas flows Into the ion generating chamber 22 at a flow rate of approximately 0.15 SSCM. Then, electrons obtained from the plasma of argon gas collides with molecules of material gas to generate plasma of the material gas. Ions are then drawn out of the plasma through the slit 27. Thus, the semiconductor wafer W is doped with ions of the impurities in the ion implantation system of FIG. 8.

If the material contained in the vaporizer 70 is used for doping, the supply of material gas to the ion generating chamber 22 by way of the supply pipe G2 is interrupted. Then, as the heater 74 is turned on, the solid material such as As contained in the melting pot 72 of the vaporizer 70 is sublimated into gas, which gas is then introduced into the ion generating chamber 22 through the nozzle 73. Electrons drawn out of the electron generating chamber 21 are caused to collide with molecules of the sublimated material to make it into plasma and generate desired ions.

Thus, the source of the material supplied to the ion generating chamber 22 can be switched from the material gas supply pipe G2 to the vaporizer and vice versa and it is not necessary for the back plate 3 to be temporarily taken out from the chamber 40. Therefore, it is not necessary to perform the exhausting operation of the chamber 40 for obtaining vacuum after the switching operation. Then, since the frequency with which the ion source unit 2 is mounted and dismounted is significantly reduced, the airtight connection between the back plate 3 and the chamber 40 is securely maintained for a prolonged period of time. Consequently, the down time of the ion implantation system will be remarkably decreased.

Additionally, the above described assembly will show an enhanced thermal efficiency because the intermediate plate 6 is thermally isolated from the ion source unit 2, while the ion source unit 2 can be mounted and dismounted with ease because the support pillars for the ion source unit 2 are detachable from the intermediate plate 6.

It will be understood that the vaporizer 70 can be used as a discharge gas supply source when it is connected to the electron generating chamber 21 in place of the discharge gas supply pipe G1.

Figure 19:
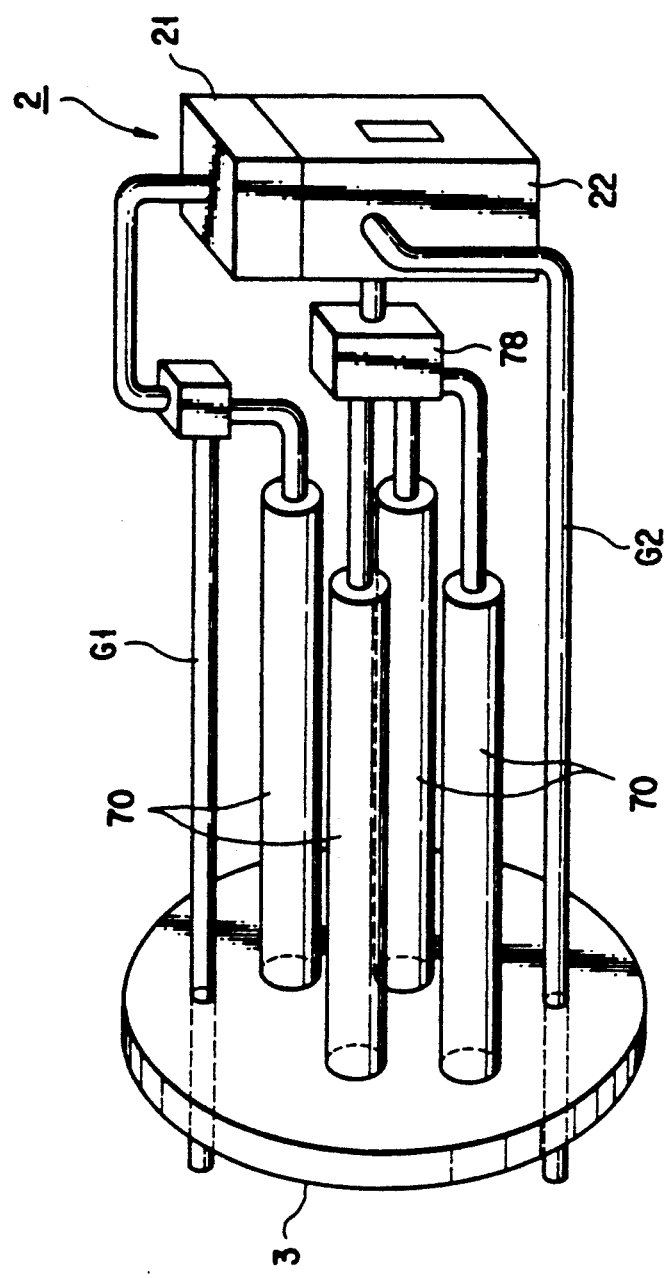
FIG. 19 is a perspective view showing a modified arrangement of the components of FIG. 15.

FIG. 19 illustrate a modification of the components of FIG. 15. The conductive rods 41a, 42a, 41b and 42b as well as the conductive straps 66 through 68 are not shown in FIG. 19 for the sake of simplification. In this modified arrangement, a plurality of vaporizers 70 containing different solid materials are connected to the gas inlet port of the ion generating chamber 22 by way of a manifold 78. With such a modified arrangement, a desired solid material can be quickly selected and served. Since the solid materials in the vaporizers 70 are not gasified unless they are heated, any desired one of the solid materials stored in the plurality of vaporizers 70 can be selectively used simply by turning on the heater 74 of the vaporizer 70 containing the selected material.

Returning to FIG. 3, it shows that selection of material gas by the control unit 12 is carried out by selectively opening one of the solenoid valves 17a through 17d that correspond to the respective material gas sources 15a through 15d. In FIG. 19, contrary to the arrangement of FIG. 3, selection of material gas can be carried out Simply by turning on selected one of the heaters 74 of the vaporizers 70. If a material in a gas phase and another material in a sold phase need to be concurrently used, the control unit 12 can realize such a combination by selectively opening selected one of the solenoid valves 17a through 17d that corresponds to the respective material gas sources 15a through 15d and turning on selected one of the heaters 74 of the vaporizers 70. Thus, it should be noted that the control system of the arrangement of FIG. 3 can be applied to the arrangement of FIG. 15 or FIG. 19 comprising one or more than one vaporizers 70.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An ion implantation system for implanting ions into an object to be processed, comprising:

a plasma generating chamber provided with an ion extraction opening;

a material source for storing outside said plasma generating chamber a material to be turned into plasma in said plasma generating chamber;

material feeding means for feeding said material in a gas phase into said plasma generating chamber from said material source;

exciting means for making said fed material into plasma in said plasma generating chamber;

supporting means for supporting said object outside said plasma generating chamber;

ion extraction means disposed downstream to said opening in the ion extraction direction;

irradiating means for irradiating said object supported by said supporting means with ions drawn by the ion extraction means from said plasma generating chamber in the form of an ion beam;

an electromagnet arranged outside said plasma generating chamber to produce a magnetic field in said plasma generating chamber, said magnetic field being formed substantially perpendicular to said ion extraction direction, locally concentrating plasma in said plasma generating chamber, and thereby forming a high density region of plasma;

a power supply for applying a current to said electromagnet to excite said electromagnet;

a memory for storing data necessary to achieve an optimum magnetic field intensity specific to the type of ions to be extracted;

an input station for specifying the type of ions to be extracted; and control means for controlling the current of said power supply for said electromagnet, said control means reading data from said memory in response to the type of ions specified in said input station and thereby so controlling the current of said power supply for said electromagnet as to achieve an optimum magnetic field intensity specific to the specified type of ions.

2. A system according to claim 1, wherein said exciting means comprises a filament arranged in said plasma generating chamber, a filament power supply for applying a filament current to said filament, and an electric discharge power supply for applying an electric discharge voltage between said filament and said plasma generating chamber.

3. A system according to claim 1, wherein said plasma generating chamber comprises an ion generating chamber provided with said opening and an electron generating chamber communicating with said ion generating chamber, and said exciting means comprises electron generating means disposed in said electron generating chamber and electron feeding means for feeding electrons generated in said electron generating chamber into said ion generating chamber, said material being made into plasma by exciting said material by means of electrons fed into said ion generating chamber.

4. A system according to claim 3, wherein said exciting means comprises a filament arranged in said electron generating chamber, a filament power supply for applying a filament current to said filament, and an electric discharge power supply for applying an electric discharge voltage between said filament and an electron extraction electrode, and means for feeding electric discharge gas to be used as auxiliary plasma for drawing out electrons, and wherein said electron feeding means comprises said electron extraction electrode for drawing electrons from auxiliary plasma generated in said electron generating chamber and an electron extraction power supply for applying a voltage between said ion generating chamber and said electron extraction electrode in order to draw electrons.

5. A system according to claim 4, further comprising:
electron beam current detecting means for detecting the beam current of electrons drawn out of said electron generating chamber;
ion beam current detecting means for detecting the beam current of ions drawn out of said ion generating chamber;
means for determining a first command value for the electron beam current on the basis of the deviation of the detected value of ion beam current from a predetermined target value of ion beam current;
means for determining a second command value for the current of said electric discharge on the basis of the deviation of the detected value of electron beam current from said first command value; and
a control unit for controlling said discharge power supply to cause said current of said electric discharge to conform to said second command value.

6. A system according to claim 2, further comprising:
ion beam current detecting means for detecting the beam current of ions drawn out of said plasma generating chamber;
means for determining a command value for the electric current of said electric discharge on the basis of the deviation of the detected value of ion beam current from a predetermined target value of ion beam current; and
a control unit for controlling said discharge power supply to cause said electric current of said electric discharge to conform to said command value.

7. A system according to claim 4, further comprising:
ion beam current detecting means for detecting the beam current of ions drawn out of said plasma generating chamber;
means for determining a command value for the electric current of said electric discharge on the basis of the deviation of the detected value of ion beam current from a predetermined target value of ion beam current; and
a control unit for controlling said discharge power supply to cause said electric current of said electric discharge to conform to said command value.

8. A system according to claim 2, further comprising:
ion beam current specifying means for specifying a target value of the beam current of ions drawn out of said plasma generating chamber;
memory means for storing a set of appropriate values for the voltage of said electric discharge capable of stably providing a ion beam current; and
a control unit for controlling said discharge power supply to cause said voltage of said electric discharge to conform to correct one of said appropriate values in response to the target value of said ion beam current specified by said ion beam current specifying means.

9. A system according to claim 4, further comprising:
ion beam current specifying means for specifying a target value of the beam current of ions drawn out of said plasma generating chamber;
memory means for storing a set of appropriate values for the voltage of said electric discharge capable of stably providing a ion beam current; and
a control unit for controlling said discharge power supply to cause said voltage of said electric discharge to conform to correct one of said appropriate values in response to the target value of said ion beam current specified by said ion beam current specifying means.

10. A system according to claim 4, further comprising:
ion beam current specifying means for specifying a target value of the beam current of ions drawn out of said plasma generating chamber; and
memory means for storing a set of appropriate values for the voltage of drawing electrons capable of stably providing a ion beam current; and
a control unit for controlling said electron extraction power supply to cause said voltage of drawing electrons to conform to correct one of said appropriate values in response to the target value of said ion beam current specified by said ion beam current specifying means.

11. A system according to claim 2, further comprising:
ion beam current specifying means for specifying a target value of the beam current of ions drawn out of said plasma generating chamber; and
memory means for storing a set of appropriate values for the flow rate of said material in a gas phase capable of reducing the noise level of said ion beam current;
a control unit for controlling said flow rate of material to cause said flow rate to conform to correct one of said appropriate values in response to the target value of said ion beam current specified by said ion beam current specifying means.

12. A system according to claim 4, further comprising:
ion beam current specifying means for specifying a target value of the beam current of ions drawn out of said plasma generating chamber; and
memory means for storing a set of appropriate values for the flow rate of said material in a gas phase capable of reducing the noise level of said ion beam current;
a control unit for controlling said flow rate of material to cause said flow rate to conform to correct one of said appropriate values in response to the target value of said ion beam current specified by said ion beam current specifying means.

13. A system according to claim 2, further comprising:
  ion beam current specifying means for specifying a target value of the beam current of ions drawn out of said plasma generating chamber; and
  memory means for storing a set of appropriate values for said magnetic field intensity capable of reducing the noise level of said ion beam current;
  a control unit for controlling said magnetic field intensity to cause said intensity to conform to correct one of said appropriate values in response to the target value of said ion beam current specified by said ion beam current specifying means.

14. A system according to claim 4, further comprising:
  ion beam current specifying means for specifying a target value of the beam current of ions drawn out of said plasma generating chamber; and
  memory means for storing a set of appropriate values for said magnetic field intensity capable of reducing the noise level of said ion beam current;
  a control unit for controlling said magnetic field intensity to cause said intensity to conform to correct one of said appropriate values in response to the target value of said ion beam current specified by said ion beam current specifying means.

15. A system according to claim 2, further comprising:
  filament current detecting means for detecting the filament current running through said filament;
  determining means for determining the degree of wear of said filament on the basis of a predetermined relationship between said filament current and said filament voltage; and
  a control unit for controlling said filament power supply as a function of said degree of wear to generate plasma.

16. A system according to claim 4, further comprising:
  filament current detecting means for detecting the filament current running through said filament;
  determining means for determining the degree of wear of said filament on the basis of a predetermined relationship between said filament current and said filament voltage; and
  a control unit for controlling said filament power supply as a function of said degree of wear to generate plasma.

17. An ion implantation system for implanting ions into an object to be processed, comprising:
  a plasma generating chamber provided with an ion extraction opening;
  a plurality of material sources for storing outside said plasma generating chamber different respective materials to be selectively made into plasma in said plasma generating chamber;
  material feeding means for feeding selected one of said materials in a gas phase into said plasma generating chamber from the material source of said selected material;
  exciting means for making said fed material into plasma in said plasma generating chamber;
  supporting means for supporting said object outside said plasma generating chamber;
  ion extraction means disposed downstream to said opening in the ion extraction direction;
  irradiating means for irradiating said object supported by said supporting means with ions drawn by the ion extraction means from said plasma generating chamber in the form of an ion beam;
  an electromagnet arranged outside said plasma generating chamber to produce a magnetic field in said plasma generating chamber, said magnetic field being formed substantially perpendicular to said ion extraction direction, locally concentrating plasma in said plasma generating chamber, and thereby forming a high density region of plasma;
  a power supply for applying a current to said electromagnet to excite said electromagnet;
  a memory for storing data necessary to achieve an optimum magnetic field intensity specific to the type of ions to be extracted;
  an input station for specifying the type of ions to be extracted;
  first control means for controlling the current of said power supply for said electromagnet, said first control means reading data from said memory in response to the type of ions specified in said input station and thereby so controlling the current of said power supply for said electromagnet as to achieve an optimum magnetic field intensity specific to the specified type of ions; and
  second control means for controlling said material feeding means, said second control means selecting the material and causing said material feeding means to feed the material in accordance with the type of ions specified by said input station.

18. A system according to claim 17, wherein a first one of said material sources stores a first one of said materials in a gas phase, a solenoid valve being provided between said first one of said material sources and said plasma generating chamber, and a second one of said material sources stores a second one of said materials in a solid phase, a heater being provided in said second one of said material sources for gasifying said second one of said material, and wherein said second control means operates said solenoid valve and said heater so as to select one of said materials.

19. A system according to claim 17, wherein said exciting means comprises a filament arranged in said plasma generating chamber, a filament power supply for applying a filament current to said filament, an electric discharge power supply for applying an electric discharge voltage between said filament and said plasma generating chamber.

20. A system according to claim 17, wherein said plasma generating chamber comprises an ion generating chamber provided with said opening and an electron generating chamber communicating with said ion generating chamber, and said exciting means comprises electron generating means disposed in said electron generating chamber and electron feeding means for feeding electrons generated in said electron generating chamber into said ion generating chamber, said material being made into plasma by exciting said material by means of electrons fed into said ion generating chamber.

21. A system according to claim 20, wherein said plasma generating chamber comprises an ion generating chamber provided with said opening and an electron generating chamber communicating with said ion generating chamber and containing said filament, and said exciting means comprises means for feeding electric discharge gas to be used as auxiliary plasma for drawing out electrons, an electron extraction electrode for drawing electrons from auxiliary plasma generated in said electron generating chamber and an electron extraction power supply for applying a voltage between said ion generating chamber and said electron extraction electrode in order to draw electrons, said material being made into plasma by exciting said material by means of said electrons fed into said ion generating chamber.

* * * * *